United States Patent [19]

Schweitzer, III

[11] Patent Number: 4,998,098

[45] Date of Patent: Mar. 5, 1991

[54] OVERVOLTAGE DETECTOR TO INDICATE VOLTAGE TO A REMOTE MONITOR

[75] Inventor: Edmund O. Schweitzer, III, Pullman, Wash.

[73] Assignee: Schweitzer Engineering Laboratories Inc., Pullman, Wash.

[21] Appl. No.: 302,398

[22] Filed: Jan. 26, 1989

[51] Int. Cl.⁵ .......................................... G08B 21/00
[52] U.S. Cl. ..................... 340/662; 361/17; 361/91; 361/86; 361/93; 324/551
[58] Field of Search ................. 340/660–662; 455/613, 618; 361/17, 91, 86, 93; 324/551, 552, 554, 548, 96

[56] References Cited

U.S. PATENT DOCUMENTS

| | | | |
|---|---|---|---|
| 3,178,697 | 4/1965 | Albright | 340/660 |
| 3,331,023 | 7/1967 | Adkins et al. | 340/660 |
| 3,560,949 | 2/1971 | Masters | 340/662 |
| 3,973,169 | 8/1979 | Titus | 361/17 |
| 3,991,367 | 11/1976 | Chapman et al. | 340/660 |
| 4,019,112 | 4/1977 | Satoh | 320/48 |
| 4,209,743 | 6/1980 | Müller et al. | 455/613 |
| 4,360,853 | 11/1982 | Welk | 340/660 |
| 4,386,315 | 5/1983 | Young et al. | 324/96 |
| 4,482,930 | 11/1984 | Peterson et al. | 361/16 |
| 4,502,937 | 3/1985 | Yagi | 455/613 |

FOREIGN PATENT DOCUMENTS

| | | | |
|---|---|---|---|
| 1591972 | 3/1971 | Fed. Rep. of Germany | 324/96 |
| 3203934 | 5/1982 | Fed. Rep. of Germany | 324/551 |
| 0031062 | 2/1989 | Japan | 324/551 |
| 1205042 | 1/1986 | U.S.S.R. | 340/662 |

*Primary Examiner*—Charles A. Ruehl
*Assistant Examiner*—J. Jackson
*Attorney, Agent, or Firm*—Flehr, Hohbach, Test, Albritton & Herbert

[57] ABSTRACT

An voltage monitoring system including means for providing a voltage from a current and for reducing the voltage. The system also includes means for integrating the current. The integrating means provides an output which increases from an initial condition at a rate proportional to the voltage. The system further includes means for sensing when the output of the integrating means is above a predetermined level and for resetting the integrating means to the initial condition. Additionally, the system includes means for indicating when the output of the integrating means exceeds the predetermined level.

26 Claims, 4 Drawing Sheets

OVERVOLTAGE DETECTOR TO INDICATE VOLTAGE TO A REMOTE MONITOR

BACKGROUND OF THE INVENTION

The present invention relates to voltage protection, and more particularly to a voltage monitoring system for control and protection, for example, of capacitors or other equipment connected between high voltage terminals.

High voltage banks of capacitors comprising a plurality of parallel-connected capacitor groups in series are well known for power factor correction on alternating current transmission and distribution circuits. They are utilized also in high voltage harmonic filters associated with power rectifiers and inverters in high voltage direct current systems of power transmission.

When a large amount of capacitive reactance is required in a high voltage system, it is standard practice to connect a large number of relatively small capacitors of standard KVA and voltage rating in parallel groups each comprising a plurality of capacitors in parallel circuit relation, and to connect a plurality of such parallel groups in series between high voltage terminals. For any selected capacitor rating, the number of series-connected capacitor groups is determined by the voltage to be imposed across the bank. For example, such a bank may comprise ten capacitors connected between paralleling buses which define each capacitor group with ten such parallel-connected groups in series between line voltage and ground potential in each leg of a wye-connected, three phase bank of capacitors. On a 230 kilovolt system, each such leg may be exposed to a repetitive peak voltage of 200,000 volts or 20,000 volts across the parallel-connected group of capacitors at each voltage level.

In such capacitor banks, it is usual to provide an individual fuse in series with each capacitor between paralleling buses at each voltage level. If any one fuse in a group of paralleled capacitors operates to disconnect a capacitor the impedance of that paralleled group increases. Total voltage across the bank then no longer divides equally among the series-connected groups, but increases on the group containing the faulted capacitor or capacitors. Standard capacitors are designed for continuous operation at 110% of rated voltage. If overvoltage of more than 10% occurs on any group of parallel-connected capacitors, as due to removal of one or more from the group by fuse operation, the remaining capacitors in the group are endangered.

The magnitude of overvoltage imposed upon any capacitor group depends of course upon the number of paralleled capacitors in the group. Desirably each group comprises a sufficient number of capacitors such that the voltage rise caused by removal of one capacitor is no greater than 10%. It is desirable however to provide protective means for ensuring that no greater overvoltage is imposed upon the remaining capacitors, and many such arrangements have been devised.

In order to detect overvoltage on parallel groups of capacitors in a series-connected bank, it is the usual practice to utilize unbalance of voltage between normally equipotential points on two or more capacitor banks in parallel between high voltage terminals. To provide such differential voltage detection, of course, a capacitor installation must be divided into at least two banks (so that the capacitors at any one voltage level are in several separate groups), or else a separate reference voltage divider must be connected across the high voltage terminals.

It is not always desirable to divide an installation into several banks of small parallel groups. Each group should contain sufficient capacitors that overvoltage due to removal of a single capacitor will be limited to no more than 10%. Also, each group should contain sufficient capacitors such that the fault current through any short-circuited capacitor will clear the associated fuse before the casing of the faulted capacitor ruptures. Even if a separate reference voltage divider is connected in parallel with a single capacitor bank, detection by voltage unbalance is subject to faulty operation as a result of external system disturbance. Moreover, the calibration of a voltage unbalance detector is adversely affected by the presence of harmonic voltages. In harmonic filters, therefore, it is especially desirable to avoid detection arrangements responsive to voltage unbalance.

It is an object of the present invention to provide improved means for detecting overvoltages of a shunt capacitor bank which comprises a single series string of parallel-connected groups of capacitors.

It is a more general object of the present invention to provide an improved overvoltage monitor for control and protection of capacitors or other equipment connected across high voltage terminals.

SUMMARY OF THE INVENTION

The present invention is directed to a monitoring system. The system may detect overvoltage and undervoltage conditions. The system includes means for providing a current from a voltage and for reducing the voltage. The system also includes means for integrating the current. The integrating means provides an output which increases from an initial condition at a rate proportional to the voltage. The system further includes means for sensing when the output of the integrating means is above a predetermined level and for resetting the integrating means to an initial condition. Additionally, the system includes means for indicating when the output of the integrating means exceeds the predetermined level. The device may also include rectifier means for providing a direct current (DC) from an alternating current (AC).

BRIEF DESCRIPTION OF THE DRAWINGS

The present invention will be more fully understood and its various objects and advantages further appreciated by referring now to the following detailed description taken in conjunction with the accompanying drawings wherein.

DESCRIPTION OF THE PREFERRED EMBODIMENTS

Figure 1:
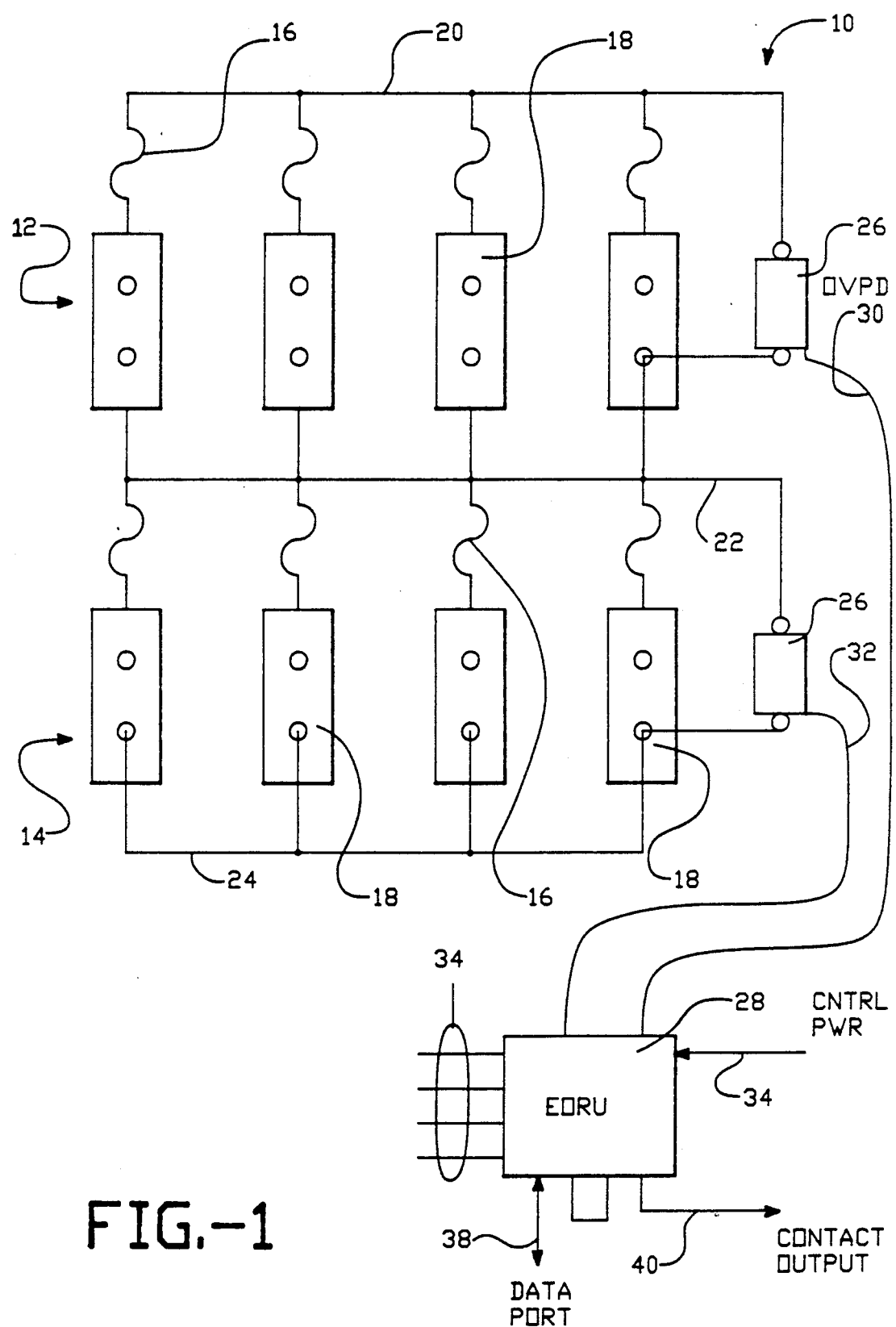
FIG. 1 is a schematic representation of the system of the present invention utilized with a plurality of parallel-connected capacitor groups connected in series.

Referring now to the drawings, wherein like reference numerals for like components are utilized throughout the drawings, attention is first directed to FIG. 1.

FIG. 1 shows a high voltage bank of capacitors 10 comprising a plurality of parallel-connected capacitor groups 12 and 14 connected in series. As is known, a fuse 16 is provided in series with each capacitor 18 connected across paralleling buses 20, 22 and 24.

As illustrated, an overvoltage protection device ("OVPD") 26 is connected across each capacitor group 12 and 14 between buses 20, 22 and 22, 24, respectively. The system of the present invention further includes an electro-optical relay unit ("EORU") 28 mounted at any appropriate location, for example on a fence post, near the capacitor bank. The EORU may be optically-linked with each OVPD 26 by means of optical fibers, for example, 30 and 32. A group of optical fibers 34 from other OVPDs is also shown.

Additionally, as will be discussed in more detail below, the EORU also has a digital data port 38 and a contact output port 40. The digital data port, among other things, is for setting system conditions, metering and event reporting. The contact output 40 is provided for signaling an overvoltage condition. The contact output may include a trouble alarm as well as alarms at different setpoints of overvoltage. Control power for the EORU is provided by means of the input port or connection 36. The control power may be from a station battery or an AC source.

Figure 2:
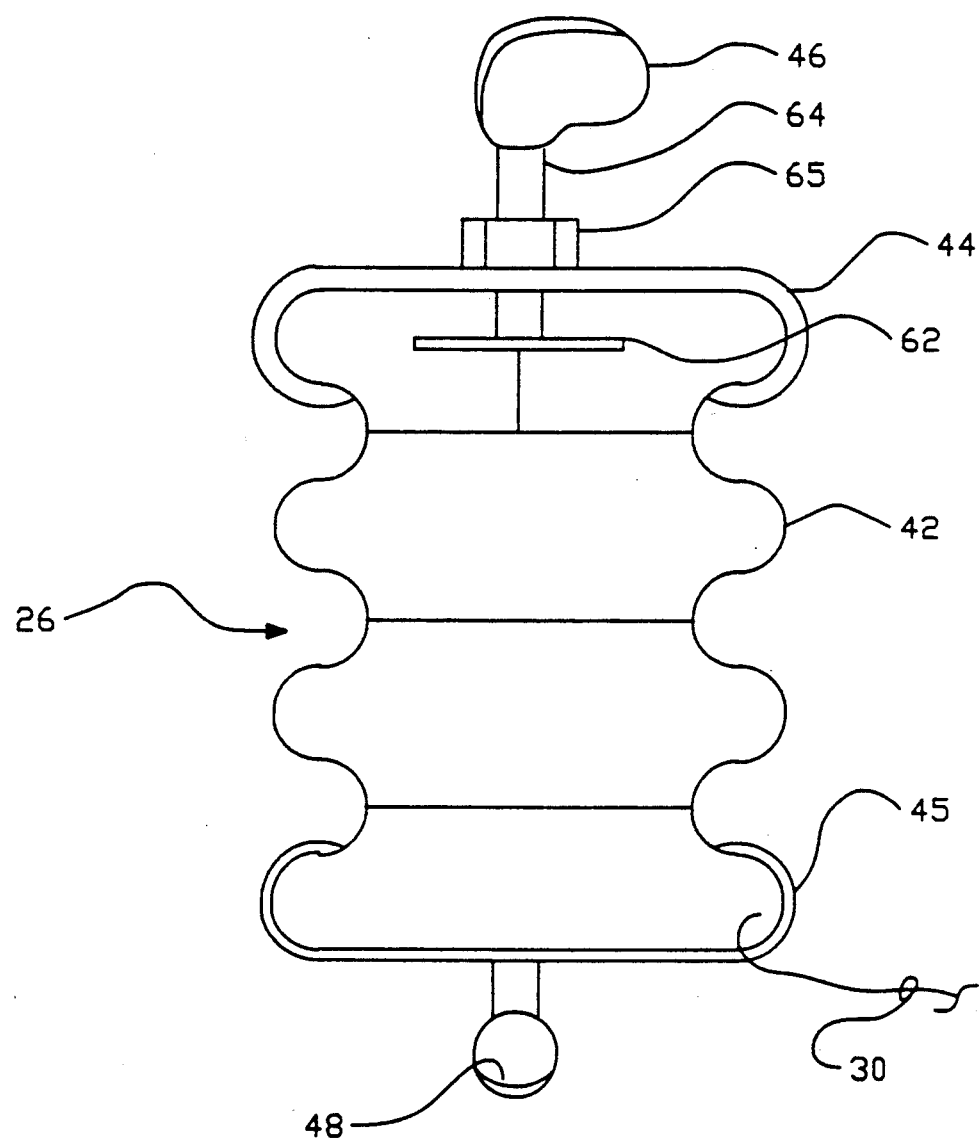
FIG. 2 is a schematic representation of the housing of an overvoltage protection device.

As shown in FIG. 2, the OVPD may comprise a tubular-shaped member 42 fabricated from a dielectric or electrically-insulating material such as a ceramic. The member, however, does not necessarily have to be tubular in shape. Other configurations may be appropriate. The member is preferably hollow so that the required electrical components may be located within the walls of the member. A metallic, electrically-conducting cap or surface 44 may be formed at one end of member 42. This cap, as will be discussed below, may form one plate of an adjustable capacitor that is part of the circuitry of the OVPD. The optical fiber 30, for example, that links the OVPD to the EORU may extend through the lower end or cap 45 to be in optical communication with, as discussed, the circuitry of the EORU.

Appropriate electrical connectors or bushings 46 and 48 are provided at opposite ends of the member for connection of the OVPD between, for example, parallel buses 20, 22 and 22, 24. For use with other equipment, such as a transformer, the OVPD could be connected across the high-voltage bushings of the equipment.

Figure 3A:
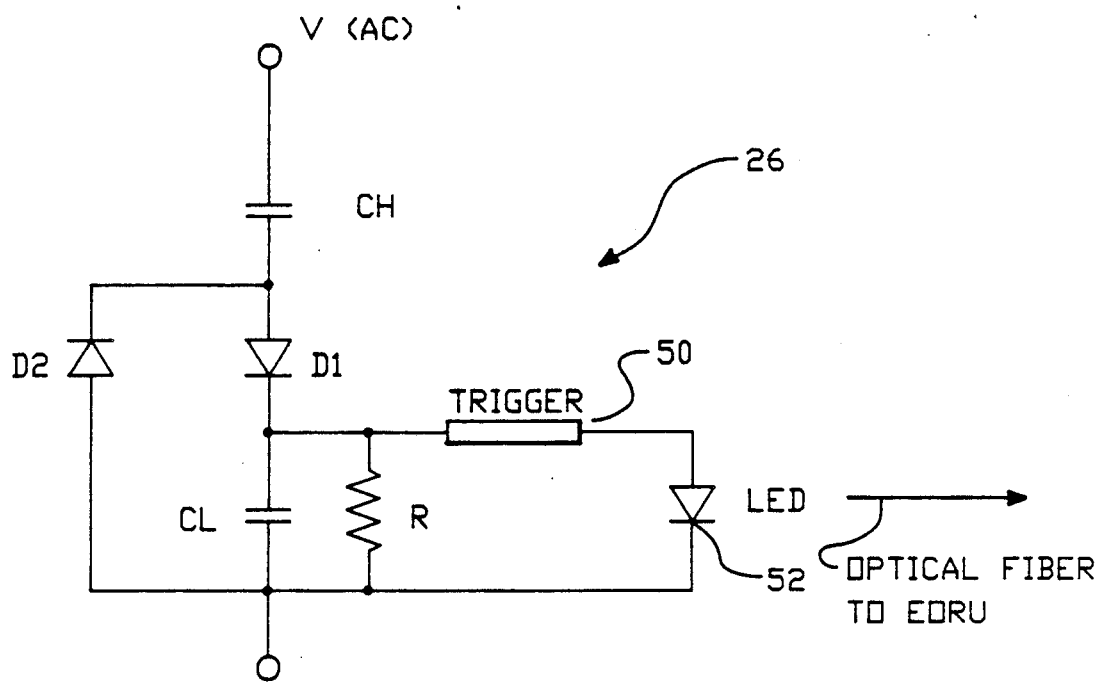
FIGS. 3A-3C are circuit diagrams for different embodiments of the overvoltage protection device.
Figure 3B:
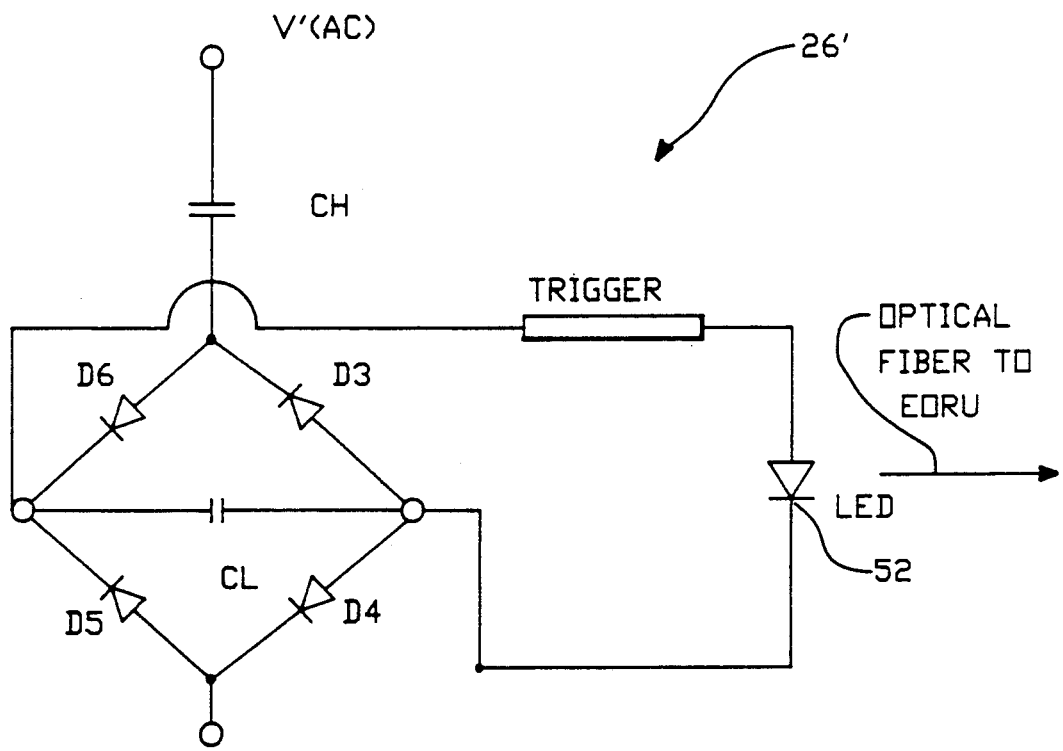
Figure 3C:
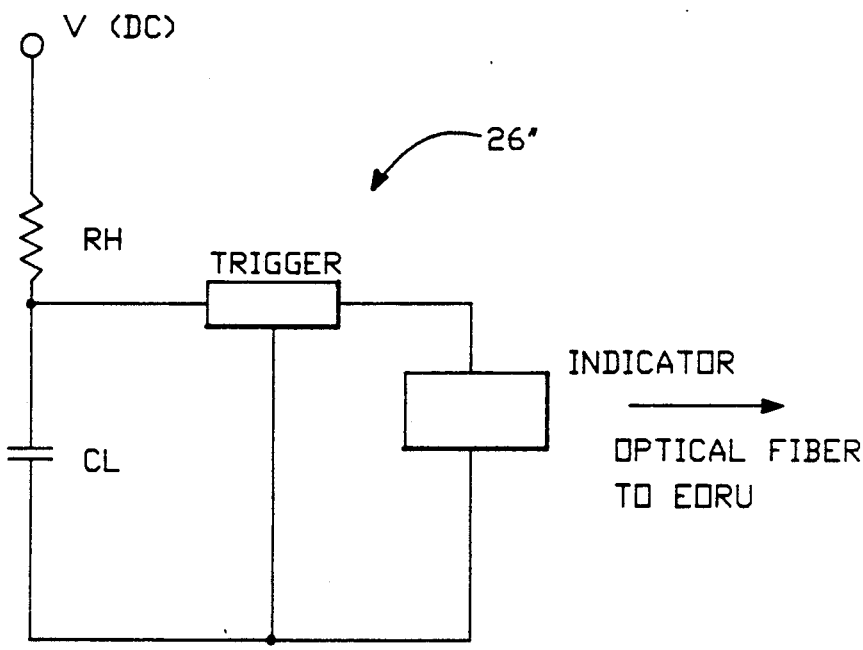

Circuitry that may be utilized for the OVPD is illustrated in FIGS. 3A–3C. FIG. 3A illustrates a circuit that may be utilized when the voltage "V" is an AC voltage such as that across buses 20, 22 and 22, 24. This circuitry includes capacitors $C_H$ and $C_L$, diodes $D_1$ and $D_2$, a trigger device 50, and a light emitting diode ("LED") 52.

Capacitor $C_H$ provides a current from the voltage source "V" and steps down the voltage to levels usable with trigger 50 and LED 52. Capacitor $C_H$ is able to withstand the high voltage V across the busses, for example, between which the parallel groups of capacitors and the OVPDs are connected. The capacitor may be a discrete high voltage capacitor or one that is integral with the OVPD housing as shown in FIG. 2.

As shown, diodes $D_1$ and $D_2$ are connected in the circuit to convert the AC current provided by capacitor $C_H$ to a direct current. The capacitor $C_L$ provides a means for integrating the direct current. The output of the integrating capacitor can increase from some initial condition at a rate proportional to the voltage "V" across the OVPD.

The trigger 50 is a means for sensing when the output of the capacitor $C_L$ is above a predetermined level. The trigger also provides a means for resetting the capacitor $C_L$ to the initial condition by discharging capacitor $C_L$ through the LED, for example.

Examples of trigger devices that may be utilized in the circuit include diacs, bilateral diodes, neon or other gas lamps, or combinations of one such device plus an appropriate transistor. Other examples include voltage-sensing integrated circuits, such as used in power failure detection apparatus.

The LED 52 is energized when the output of the capacitor $C_L$ exceeds a predetermined level. When energized, the LED will transmit optical information via optical cable 30, for example, to the EORU. The optical information may be a light pulse.

The frequency of blinking or pulse rate of the LED is proportional to the voltage detected by the OVPD. The higher the pulse rate, the greater the voltage. Instead of generating a pulse rate proportional to the detected voltage, the OVPD may alternatively generate pulses only in abnormal overvoltage conditions.

Also, it would be possible to replace the LED with another form of indicator (see FIG. 3C) that generates electromagnetic radiation or even an audible signal. An example of the former is a neon lamp or an oscillator. An example of the latter is a piezoelectric transducer. Still another way to obtain an output signal, electrically-insulated from the input, is to replace the LED with a transformer.

Also, as shown in FIG. 3A, a resistor R may be connected in parallel with capacitor $C_L$. With the resistor R present, the voltage V reaches a steady state value after some time constant (RC) whenever that steady state value is less than the trigger point of trigger 50. Because of the RC time constant, a sudden overvoltage condition, such as a switching surge, is less likely to cause an unwarranted operation.

FIG. 3B illustrates an OVPD 26' that may be utilized with an AC voltage source V'. As shown, this circuit includes a rectifier bridge comprising diodes $D_4$–$D_6$.

FIG. 3C illustrates a circuit for OVPD 26" for use with a DC voltage source V"'. In this circuit, the capacitor $C_H$ has been replaced by a resistor $R_H$. Additionally, since the voltage source is DC, there is no need to provide rectifier circuitry. Also note that the indicator may be a LED or some other such indicating device, as discussed above.

A circuit of the type illustrated in FIG. 3A utilized where V nominally is 20 KV may use circuit elements with the following parameters: $C_H = 5$ pf, $C_L = 1$ μf, and $D_1$ and $D_2$ are silicon diodes.

Referring back to FIG. 2, there is illustrated an arrangement wherein capacitor $C_H$ may have adjustable plates with the spacing between the plates being calibrated. Specifically, one of the plates of capacitor $C_H$ may comprise the electrically-conducting cap 44 of housing 42 with a lower plate 62 being disposed from plate 44. A nut 64 and bolt 65 arrangement, for example, may be provided to alter the spacing between plates 44 and 62, and thus, adjust the capacitance of capacitor $C_H$. As shown, the bolt 64 may include bushing 46.

The EORU 28 measures or counts the pulse rate received from the LEDs, for example, of any given number of OVPDs (see FIG. 1). The pulse rate information may be converted to voltage units, and when the detected information exceeds a threshold level, indicating an overvoltage, a contact may be closed and a message generated via port 40. Such threshold detection may occur in the OVPD or in the EORU. However, if threshold detection occurs in the OVPD then the light pulses directly signify overvoltage and undervoltage conditions.

Figure 4:
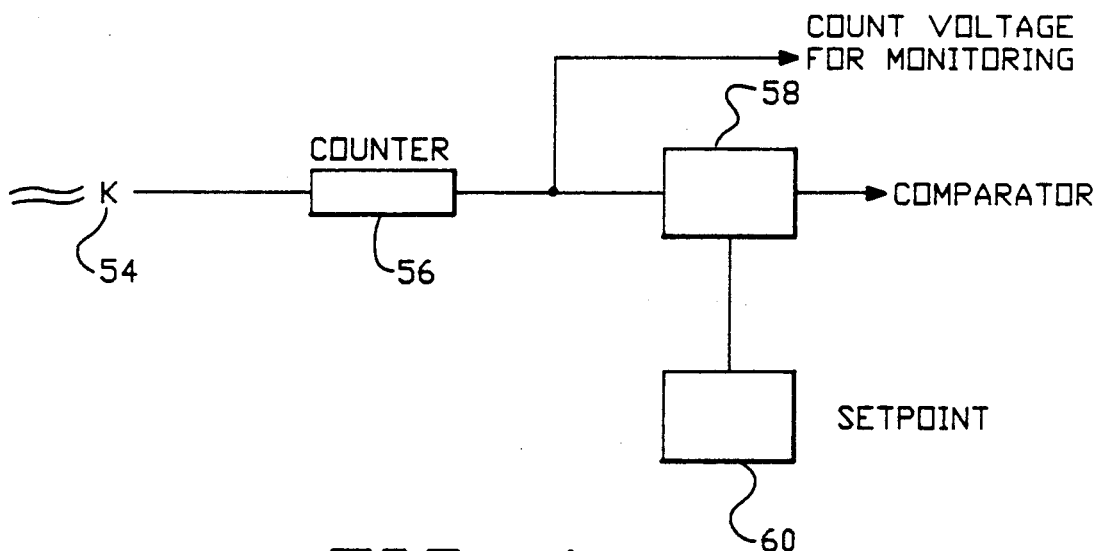
FIG. 4 is a schematic block diagram of the electro-optical relay unit.

A simple block diagram illustrating circuitry within the EORU is illustrated in FIG. 4. This circuitry may include a photodetector 54 for detecting the light pulses generated by LED 52. A counter 56 is provided for counting the pulses. It may provide a digital or analog indication of voltage. The pulses may be counted per unit of time to obtain a quantity proportional to the voltage V, or the time between pulses may be measured. A comparator 58 is provided to indicate when an initial voltage condition has been exceeded indicating an overvoltage condition. The setpoint 60 establishes what the threshold or initial condition is. As shown, the pulses may also be counted for purposes of monitoring the condition of the capacitor banks or other apparatus. This information is available at contact output port 40. These functions may be implemented by an appropriately-programmed microprocessor.

Although the invention has been described as utilized to protect capacitors in a high voltage bank of parallel-connected capacitor groups, it should be understood that the invention may be applied to other equipment where it is desirable to monitor and protect against voltage deviations from nominal. Thus, the system of the present invention may be utilized with machines operating at high voltages, cables and other transmission and/or distribution means, transformers, reactors, and both shunt and series capacitor banks.

Although certain embodiments of the invention have been described herein in detail, the invention is not to be limited only to such embodiments, but rather only by the appended claims.

What is claimed is:

1. A voltage monitoring system for protecting a device having a voltage thereacross comprising:
   means for providing a current from the voltage and for reducing the voltage;
   means for integrating said current, said integrating means providing an output which increases from an initial condition at a rate proportional to said voltage;
   a trigger for sensing when the output of said integrating means is above a predetermined level and for establishing the predetermined level;
   means for indicating when the output of said integrating means exceeds the predetermined level in order to detect the voltage across the device;
   said trigger resetting said integrating means to the initial condition by discharging said integrating means through said indicating means; and
   said current providing means, said integrating means, said trigger and said indicating means disposed within a hollow member formed from an electrically-insulating material, said member including means for connection across a voltage potential.

2. The system of claim 1 wherein said current providing means is a resistor.

3. The system of claim 2 wherein said integrating means is a capacitor connected in series with said resistor.

4. A voltage monitoring system, comprising: a first capacitor for providing an alternating current from an alternating current voltage source and for reducing said voltage;
   rectifier means for providing a direct current from said alternating current;
   means for integrating said direct current, said integrating means providing an output which increases from an initial condition at a rate proportional to said voltage;
   a trigger device for sensing when the output of said integrating means is above a predetermined level and for resetting the integrating means to the initial condition, said trigger device not drawing current from said integrating means when the output thereof is below the predetermined level; and
   means for indicating when the output of said integrating means exceeds the predetermined level.

5. The system of claim 4 wherein said first capacitor, said rectifier means, said integrating means, said sensing means, and said indicating means are disposed within a hollow member formed of a dielectric material, said member including electrically-conductive bushings at either end thereof.

6. The system of claim 4 wherein said first capacitor is connected between one terminal of the alternating current voltage source and said rectifier means.

7. The system of claim 6 wherein said rectifier means includes a diode bridge.

8. The system of claim 6 wherein said rectifier means includes a pair of diodes.

9. The system of claims 6, 7, or 8 wherein said integrating means includes a second capacitor.

10. The system of claim 6 wherein the spacing between plates of said first capacitor are adjustable.

11. The system of claim 10 wherein one plate of said first capacitor comprises an electrically-conductive surface that is formed at one end of a hollow member constructed of an electrically-insulating material and wherein the other plate of said first capacitor is disposed within said member.

12. The system of claim 11 wherein said rectifier means, said integrating means, said sensing means, and said indicating means are disposed within said member.

13. The system of claim 4 wherein said trigger device is selected from the group consisting of a diac, a bilateral diode, a voltage-sensing integrated circuit, and a gas lamp.

14. The system of claim 1 or 4 further including means in communication with said indicating means for determining said voltage.

15. The system of claim 1 or 4 wherein said indicating means is a light emitting device.

16. The system of claim 15 further including means in optical communication with said light emitting device for determining said voltage.

17. The system of claim 16 wherein said means in optical communication includes a photodetector, a counter means and a comparator means.

18. A system for protecting and monitoring a device having a voltage thereacross, comprising:
   means for providing a current from the voltage and for reducing the voltage;
   means for integrating the current, said integrating means providing an output which increases from an initial condition at a rate proportional to the voltage;
   a trigger for sensing when the output of said integrating means is above a predetermined level and for establishing the predetermined level;

light emitting means for producing a light pulse when the output of said integrating means exceeds the predetermined level;

said trigger resetting said integrating means to the initial condition by discharging said integrating means through said light emitting means;

optical fiber means for conducting the light pulse from said light emitting means to a light pulse receiver means for determining the voltage; and said current providing means, said integrating means, said trigger, and said indicating means disposed within a hollow member formed of a dielectric material, said member including electrically-conductive bushings at either end thereof for connection across the device.

19. The system of claim 18 further including a rectifier means for providing a direct current from an alternating current wherein the voltage across the device is an alternating current voltage, and said rectifier means is disposed within said member.

20. A method for monitoring voltage, comprising:
providing an alternating current from an alternating current voltage source and reducing said voltage by means of a capacitor;
providing a direct current from said alternating current;
integrating said direct current and providing an output which increases from an initial condition at a rate proportional to said voltage;
sensing when said output is above a predetermined level and resetting to the initial condition; and
indicating when said output exceeds the predetermined level.

21. The method of claim 20 wherein a light emitting device is utilized to indicate when said output exceeds the predetermined level.

22. The method of claim 21 further including optically communicating with said light emitting device to determine said voltage.

23. The method of claim 22 further including detecting light pulses generated by said light emitting device and counting said light pulses.

24. The method of claim 23 further including comparing the count of said light pulses to a setpoint to determine said voltage.

25. A method for protecting and monitoring a device having a voltage thereacross, comprising:
providing a current from the voltage and reducing the voltage;
integrating the current by an integrating means and providing an output which increases from an initial condition at a rate proportional to the voltage;
sensing when said output is above a predetermined level and resetting to the initial condition, said sensing step not requiring current from the integrating means when the output thereof is below the predetermined level;
producing a light pulse when said output exceeds the predetermined level;
transmitting the light pulse to a light pulse receiver means at a remote location for determining the voltage; and
counting said light pulse to determine the voltage.

26. The method of claim 25 further including providing a direct current from an alternating current when the voltage across the device is an alternating current voltage.

* * * * *